United States Patent [19]

Tanisawa

[11] Patent Number: 5,283,446
[45] Date of Patent: Feb. 1, 1994

[54] COMPACT OPTICAL SEMICONDUCTOR MODULE CAPABLE OF BEING READILY ASSEMBLED WITH A HIGH PRECISION

[75] Inventor: Yasuhisa Tanisawa, Tokyo, Japan
[73] Assignee: NEC Corporation, Tokyo, Japan
[21] Appl. No.: 933,812
[22] Filed: Aug. 24, 1992
[30] Foreign Application Priority Data Aug. 30, 1991 [JP] Japan .................. 3-245207

[51] Int. Cl.$^5$ .................. H01L 27/14; H01L 31/00
[52] U.S. Cl. .................. 257/433; 257/99; 257/737; 257/778; 257/779
[58] Field of Search .................. 257/98, 99, 432, 433, 257/690, 692, 735, 736, 737, 738, 779, 780, 782, 784, 781, 778; 361/406

[56] References Cited

U.S. PATENT DOCUMENTS 5,001,829 3/1991 Schelhorn .................. 257/690
5,134,340 7/1992 Haitz .................. 257/99

FOREIGN PATENT DOCUMENTS 63-236376 10/1988 Japan .................. 257/99
2-196476 8/1990 Japan .................. 257/99

OTHER PUBLICATIONS

Katsura et al., Journal of Lightwave Technology, vol. 8, No. 9, pp. 1323–1327, Sep. 1990.

Primary Examiner—William Mintel
Assistant Examiner—Minhloan Tran
Attorney, Agent, or Firm—Foley & Lardner

[57] ABSTRACT

In an optical semiconductor module having an optical semiconductor chip mounted on a substrate through a plurality of solder bumps each of which has a predetermined height and which is formed by molten solder, each of the bumps is surrounded by a side wall lower than the predetermined height of each bump. The optical semiconductor chip is precisely positioned on the substrate not only in a horizontal direction by self-alignment effect of the molten solder but also in a vertical direction due to shrinkage of the molten solder with a bottom surface of the optical semiconductor chip kept in contact with an upper surface of the side walls, upon cooling the molten solder.

11 Claims, 6 Drawing Sheets

COMPACT OPTICAL SEMICONDUCTOR MODULE CAPABLE OF BEING READILY ASSEMBLED WITH A HIGH PRECISION

BACKGROUND OF THE INVENTION

The present invention relates to an optical semiconductor module for use in an optical communication system and a method of manufacturing the optical semiconductor module.

Till now, an optical semiconductor module has been widely used in an optical communication system such as a Local Area Network (LAN), a CATV system. Specifically, the optical semiconductor module comprises a substrate and an optical semiconductor chip mounted on the substrate. In this case, and the optical semiconductor chip generally has an optical element, such as a Laser Diode (LD) array, or a Light Emitting Diode (LED) array, an Avalanche Photo Diode (APD) array. An optical waveguide is formed on the substrate and is optically coupled to the optical element. With this structure, it is possible to transmit an optical beam between the optical semiconductor chip and the optical waveguide. This enables application of such an optical semiconductor module to the optical communication system.

Recent efforts have been made to reduce the size of the optical semiconductor module and to manufacture the optical semiconductor module at a low cost.

In order to satisfy the above-mentioned goal of small size at a low cost, a conventional optical semiconductor module has been proposed which has been small in size and able to be mass-produced. The conventional optical semiconductor module, as will later be described in detail, utilizes a flip-chip interconnection technique on a face-down bonding technique. With this technique, a plurality of first electrodes on the optical semiconductor chip are electrically connected to a plurality of second electrodes on the substrate through a plurality of small solder bumps. According to this technique, precise self-alignment is accomplished between the first and the second electrodes by the solder bumps, because each bump has surface tension, as known in the art. This self-alignment effect results in easy assembly of the optical semiconductor module.

However, in order to take advantage of the aforesaid self-alignment effect, sufficient consideration must be given to the height of each bump. Particularly, necessary that each solder bump have a predetermined height so as to enhance the self-alignment effect. However, even when each solder bump has the predetermined height, the chip would not be positioned in place in a vertical direction. The reason is that the solders irregularly shrink and are varied in height from one another when they are cooled. Further, when the chip is positioned with a poor precision in the vertical direction, the optical element is not flush with the optical waveguide. This results in degradation of transmission characteristics of the optical semiconductor module.

SUMMARY OF THE INVENTION

It is an object of this invention to provide an optical semiconductor module in which an optical semiconductor chip mounted on a substrate is positioned precisely both in horizontal and vertical directions at the substrate.

It is another object of this invention to provide an optical semiconductor module of the type described, which is capable of being mass-produced because of its easy assembly.

According to this invention, an improved optical semiconductor module which is for use in an optical communication system is provided. It comprises an optical semiconductor chip mounted on a substrate, the optical semiconductor chip having a chip surface on which a plurality of first electrodes are deposited while the substrate has a plurality of second electrodes which are electrically connected to the first electrodes through a plurality of bumps each of which has a predetermined height and a first height for shrunken bumps, wherein each of the bumps is surrounded by a side wall which has a wall height lower than the predetermined height and substantially equal to the first height.

The side walls are defined by an insulating layer deposited on the principal surface.

The side walls may be defined by a plurality of recesses each of which is recessed from the principal surface and which has a recess depth lower than the predetermined height and substantially equal to the first height. The recesses may be formed by etching prior to deposition of the second electrodes.

An improved method of manufacturing an optical semiconductor module is also provided according to this invention. The method is for manufacturing an optical semiconductor module which comprises an optical semiconductor chip mounted on a substrate.

The method comprises the steps of depositing a plurality of first electrodes on a chip surface of the optical semiconductor chip, depositing a plurality of second electrodes at preselected portions of the substrate which are surrounded by side walls each of which has a predetermined height, forming, on the second electrodes, a plurality of conductive bumps each of which has a height higher than the predetermined height, and electrically connecting the conductive bumps to the first electrodes and when shrunk the bumps have a first height.

DESCRIPTION OF THE PREFERRED EMBODIMENT

Figure 1:
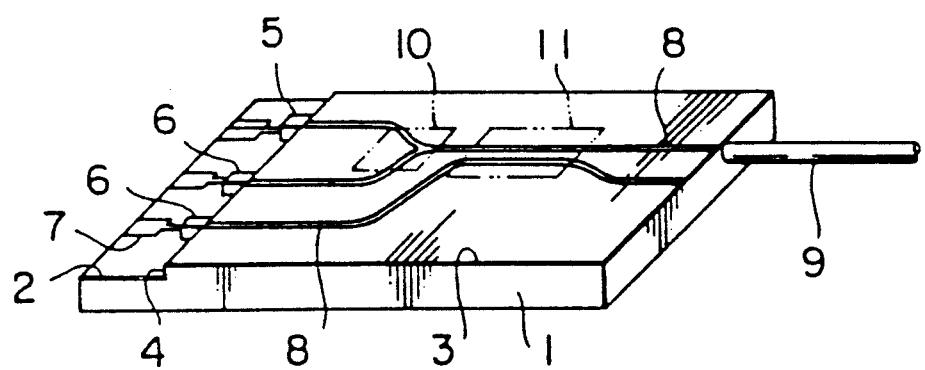
FIG. 1 is a perspective view for use in describing an optical semiconductor module to which this invention is applicable.
Figure 2A:
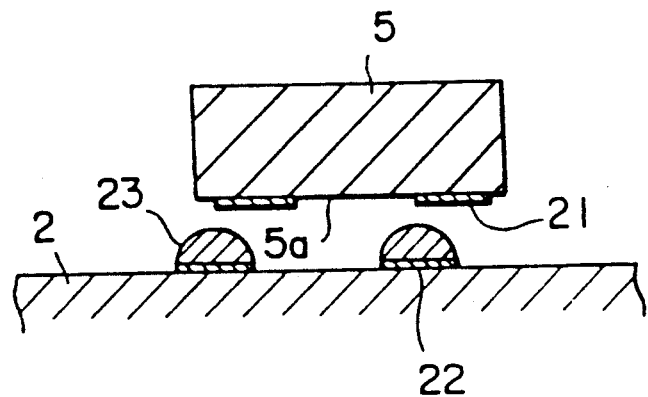
FIGS. 2(A), 2(B), and 2(C) are sectional views for use in describing a conventional method of connecting an optical semiconductor chip to a substrate through solder bumps at each step.
Figure 2B:
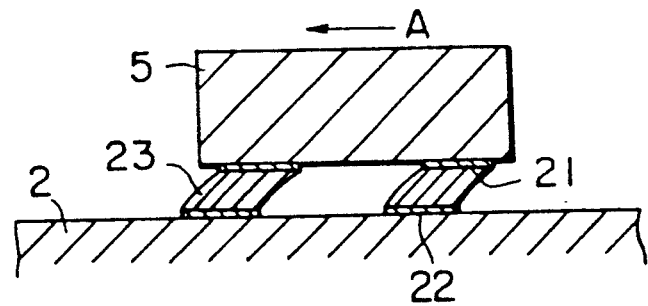
Figure 2C:
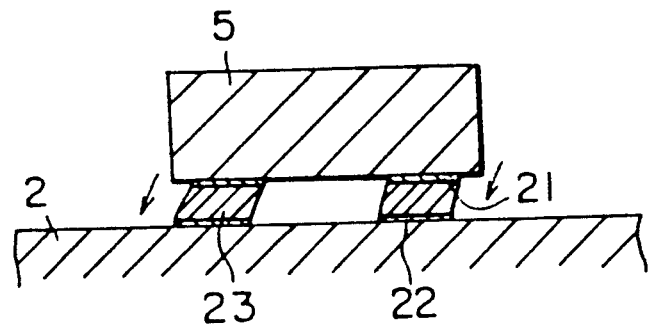
Figure 3:
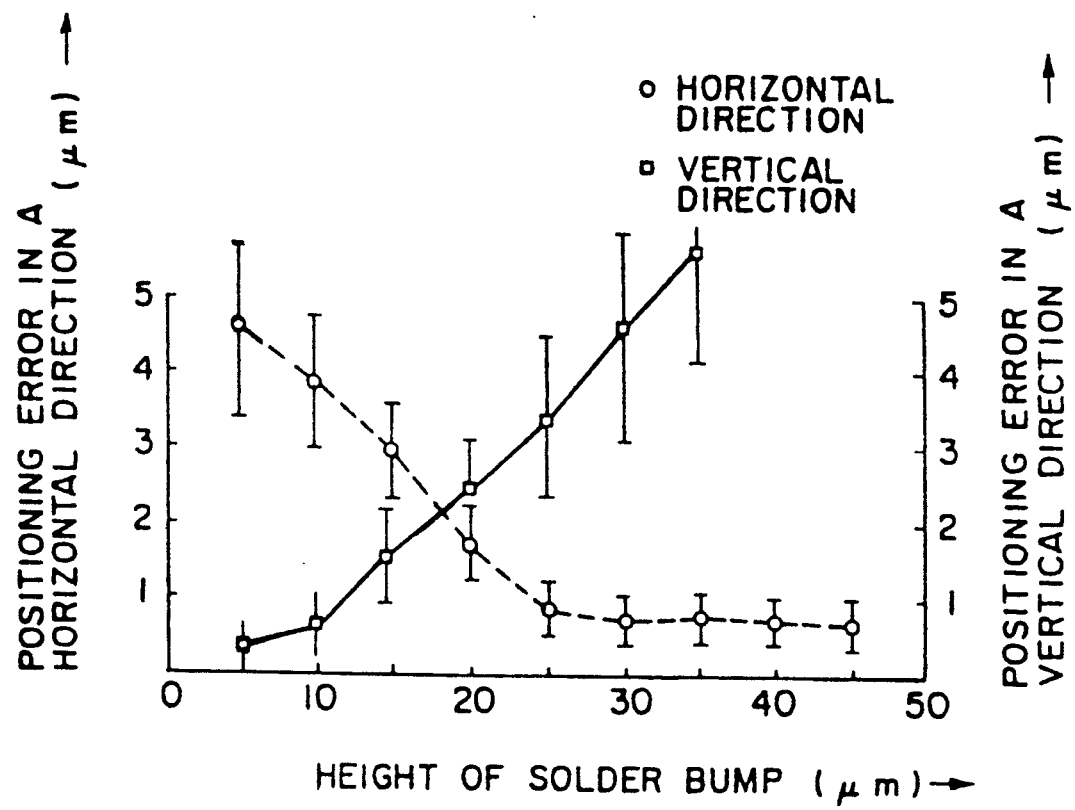
FIG. 3 is a graphical representation for use in describing a relationship between a height of each solder bump and a positioning error appearing on positioning an optical semiconductor chip on a substrate.

Referring to FIGS. 1 through 3, a conventional optical semiconductor module will first be described for a better understanding of this invention.

In FIGS. 1 and 2, illustration is made about an optical semiconductor module which is for use in a two-way transmission system. The optical semiconductor module comprises a substrate 1 which is made of silicon. The substrate 1 has a principal surface 2 directed upwards of FIG. 1 and partially laid on the lefthand side of FIG. 1, a secondary surface 3 directed upwards of FIG. 1 also and laid on the righthand side of FIG. 1, and a side surface 4 between the principal and the secondary surfaces 1 and 2. The secondary surface 3 is elevated from the principal surface 2 while the side surface 4 is contiguous to the principal surface 2 and the secondary surface 3. On the principal surface 2, an LD (Laser Diode) chip 5 and PD (Photo Diode) chips 6 and 6 are mounted with all of the chips 5 and 6 connected to electrode patterns 7. On the secondary surface 3, $SiO_2$ optical waveguides 8 and 8 are laid with a prescribed height kept relative to the principal surface 2. A lefthand end portion of each optical waveguide 8 is optically coupled to each of the LD chip 5 and the PD chips 6 and 6 and another end portion, namely, a righthand end portion of each optical waveguide 8 is optically coupled to an optical fiber 9. Additionally, an optical branch section 10 and an optical wave separator section 11 are formed on a center portion of the secondary surface 3.

Now, referring to FIGS. 2(A), (B), and (C), description will be made as to a method of mounting the LD chip 5 or the PD chips 6 and 6 on the principal surface 2 through solder bumps 23 to manufacture the optical semiconductor module illustrated in FIG. 1.

In FIG. 2(A), the LD chip 5 has a chip surface 5a directed downwards of FIG. 2(A) while the substrate 1 has the principal surface 2 directed upwards of FIG. 2(A). As shown in FIG. 2(A), a plurality of first electrodes 21 are deposited on the chip surface 5a while a plurality of second electrodes 22 are deposited on the principal surface 2.

As illustrated in FIG. 2(A), the chip surface 5a and the principal surface 2 are in a face-to-face relationship.

In order to connect the LD chip 5 and the principal surface 2, a plurality of conductive solder bumps 23 are directly formed on the second electrodes 22. It is assumed in FIG. 2(A) that the solder bumps 23 are put in a molten state and kept only on the second electrodes 22 by surface tension of each solder bump 23. Consequently, the solder bumps 23 have semispherical configurations in cross section, as shown in FIG. 2(A).

In FIG. 2(B), the LD chip 5 rests on the solder bumps 23 so that the solder bumps 23 are brought into contact with the first electrodes 21. In this event, if the solder bumps 23 have a desired height and a desired viscosity and come into contact with the first electrodes 21, the LD chip 5 may be horizontally somewhat displaced from the solder bumps 23, as illustrated in FIG. 2(B). This is because the solder bumps 23 have surface tension and the LD chip 5 tends to be horizontally moved due to the surface tension, as symbolized by an arrow A. As a result, the LD chip 5 is automatically located in place on the solder bumps 23. Thus, the first electrodes 21 of the LD chip 5 are conveniently aligned with the second electrodes 22, as illustrated in FIG. 2(C). Thus, self-alignment between the first and the second electrodes 21 and 22 is accomplished by using the surface tension of the solder bumps 23. Such self-alignment is effective to precisely place the LD chip 5 on the principal surface 2.

Thus, the second electrodes 22 are electrically connected to the first electrodes 21 through the conductive solder bumps 23.

However, the conventional method is disadvantageous in that the solder bumps 23 should be controlled in their heights, as pointed out in the background section of the instant specification. In other words, precision of the self-alignment depends on the solder bumps 23.

Referring now to FIG. 3, illustration is made about a relationship between a height of the solder bumps and positioning errors measured along horizontal and vertical directions. As will be understood from FIG. 3, it is necessary to render each solder bump into a height which is not less than 30 $\mu$m in order that the positioning error along the horizontal direction may be limited within a range of 1 $\mu$m. On the contrary, when the height of each solder bump exceeds 10 $\mu$m, the vertical error would unfavorably exceed 1 $\mu$m. As shown in FIG. 3, when the height of each solder bump 23 exceeds 10 $\mu$m, the vertical error becomes large as each solder bump 23 becomes high. Therefore, it is very difficult to precisely position the optical semiconductor chip both in horizontal and vertical directions.

Figure 4:
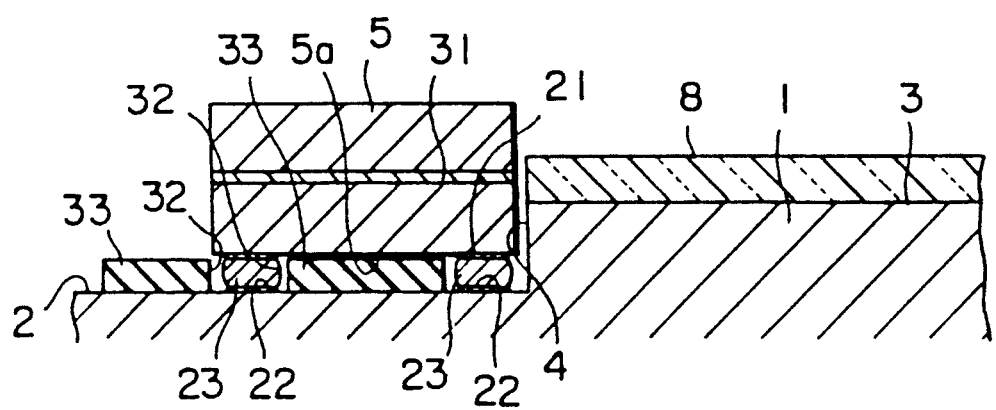
FIG. 4 is a sectional view of an optical semiconductor module according to a first embodiment of this invention.

Referring to FIG. 4, description will proceed to an optical semiconductor module according to a first embodiment of this invention. The illustrated optical semiconductor module comprises some parts which are similar to those of the above-described conventional optical semiconductor module and which are represented by the common reference numerals.

As in FIG. 1, the optical semiconductor module illustrated in FIG. 4 comprises the substrate 1 which has the principal surface 2, the secondary surface 3 and the side surface 4. On the secondary surface 3, a $SiO_2$ layer is deposited by flame sedimentation and is subjected to patterning and etching to be formed into the $SiO_2$ optical waveguide 8. On the principal surface 2 recessed from the secondary surface 3, the optical semiconductor chip 5 is mounted and has an optical element 31, such as an LD (Laser Diode) array, which is laid in the middle portion of the optical semiconductor chip 5, as shown in FIG. 4, and which is coupled to the optical waveguide 8. In this connection, the light-emitting surface of the optical element 31 is directed towards the optical waveguide 8.

Figure 5A:
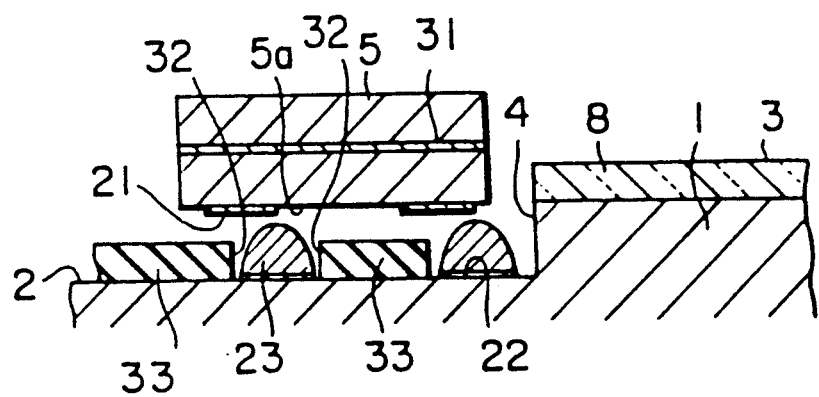
FIGS. 5(A), 5(B), and 5(C) are sectional views for use in describing a method of manufacturing the optical semiconductor module illustrated in FIG. 4.

On the chip surface 5a of the optical semiconductor chip 5 which is directed downwards of FIG. 4, the first electrodes 21 are deposited at preselected portions of the chip surface 5a of the optical semiconductor chip 5. The first electrodes 21 are electrically and internally connected to the optical element 31 to supply electric power to the optical element 31 and serve to position the optical semiconductor chip 5 on the principal surface 2 in place, as will later be described. On the other hand, the second electrodes 22 are deposited on the principal surface 2, like in FIG. 2. Each second electrode 22 of a Cr-Pt-Au composition is arranged in one-to-one correspondence to the first electrodes 21. The first electrodes 21 on the optical semiconductor chip 5 and the second electrodes 22 on the principal surface 2 are electrically connected to one another through the solder bumps 23, like in FIG. 2. Herein, it is to be noted that each of the solder bumps 23 is surrounded by a side wall 32 defined by an insulating layer 33 deposited on the principal surface 2. The insulating layer 33 consists of $SiO_2$ layer. Each of the side walls 32 has a wall height lower than a height of each solder bump 23. The height of each solder bump 23 may be called a predetermined height before shrinking as shown in FIG. 5(A) and a first height after shrinking as shown in FIG. 5(C) and as explained below. In the illustrated example, each second electrode 22 has a thickness of approximately 3,000 Å and the insulating layer 33 has a thickness of approximately 5 μm. In addition, each solder bump 23 has a diameter of approximately 40 μm and a height of approximately 20 μm.

Now, referring to FIGS. 5(A), (B), and (C), description will be made as to a method of mounting the optical semiconductor chip 5 on the principal surface 2 through the solder bumps 23 to manufacture the optical semiconductor module illustrated in FIG. 4.

As illustrated in FIG. 5(A), each first electrode 21 is deposited on the chip surface 5a of the optical semiconductor chip 5. The insulating layer 33 which has a thickness of approximately 5 μm previously surrounds the solder bumps 23 in FIG. 5. Such an insulating layer 33 is attained by uniformly depositing an insulating material on the principal surface 2 to a thickness of 5 μm and by selectively etching the insulating material from preselected portions defined on the principal surface 2. Then, each second electrode 22 which has a thickness of approximately 3,000 Å is formed on the preselected portions. Consequently, each second electrode 22 is surrounded by the side wall 32 formed by the insulating layer 33. Thereafter, the conductive solder bumps 23 are formed on the second electrodes 22 each of which has a diameter of approximately 40 μm and a height of approximately 20 μm. As in FIG. 2(A), the solder bumps 23 illustrated in FIG. 5(A) are also put in a molten state and have semispherical configurations in cross section on the second electrodes 22 by a surface tension of each solder bump 23.

Figure 5B:
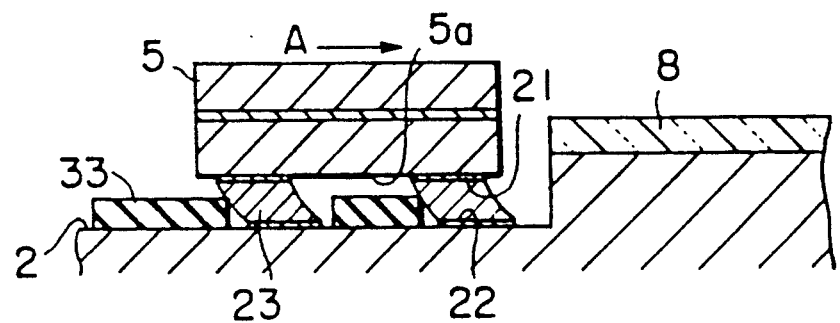
Figure 5C:
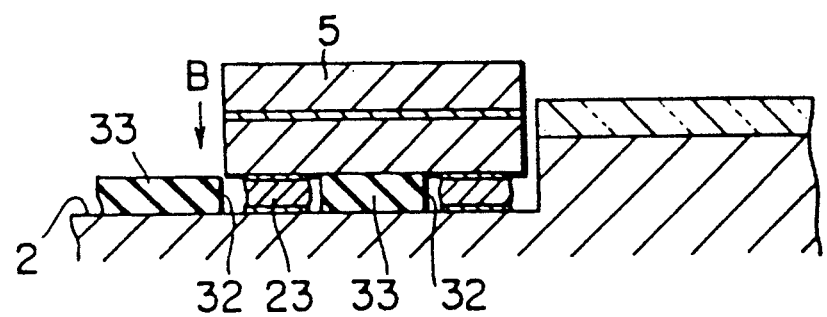

In FIG. 5(B), the optical semiconductor chip 5 rests on the solder bumps 23 so that the solder bumps 23 are brought into contact with the first electrodes 21. In this event, the optical semiconductor chip 5 may be horizontally somewhat displaced from the molten solder bumps 23 as illustrated in FIG. 5(B). Even when such displacement of the optical semiconductor chip 5 takes place in relation to the molten solder bumps 23, the molten solder bumps 23 serve to horizontally move the optical semiconductor chip 5, as symbolized by an arrow A and the optical semiconductor chip 5 is automatically located in place on the solder bumps 23.

Thereafter, the optical semiconductor module is cooled and each solder bump 23 shrinks while the optical semiconductor module is cooled. As a result, as illustrated in FIG. 5(C), the optical semiconductor chip 5 is pulled downwards by shrunk solder bumps, as symbolized by an arrow B.

However, since each second electrode 22 is surrounded by the side wall 32 formed by the insulating layer 33 which has a thickness of approximately 5 μm, the optical semiconductor chip 5 is kept in a height or vertical direction at a position where the chip surface 5a of the optical semiconductor chip 5 comes into contact with an upper surface of the insulating layer 33, as shown in FIG. 5(C). At the above-described position, the optical semiconductor chip 5 is supported on the principal surface 2 so that the optical element 31 is precisely flush with the optical waveguide 8. Accordingly, precise chip positioning is accomplished not only in a horizontal direction by the aforesaid self-alignment effect of the molten solder but also in a vertical direction by the aforesaid contact of the chip surface 5a of the optical semiconductor chip 5 and the upper surface of the insulating layer 33.

In order to estimate such precision in chip positioning, each positioning error in horizontal and vertical directions has been measured after the processes symbolized by FIGS. 5(A) through 5(C) have been completed. In this event, each positioning error is approximately 0.5 μm. Thus, it has been confirmed that precise chip positioning in the horizontal and the vertical directions is sufficiently achieved.

Figure 6:
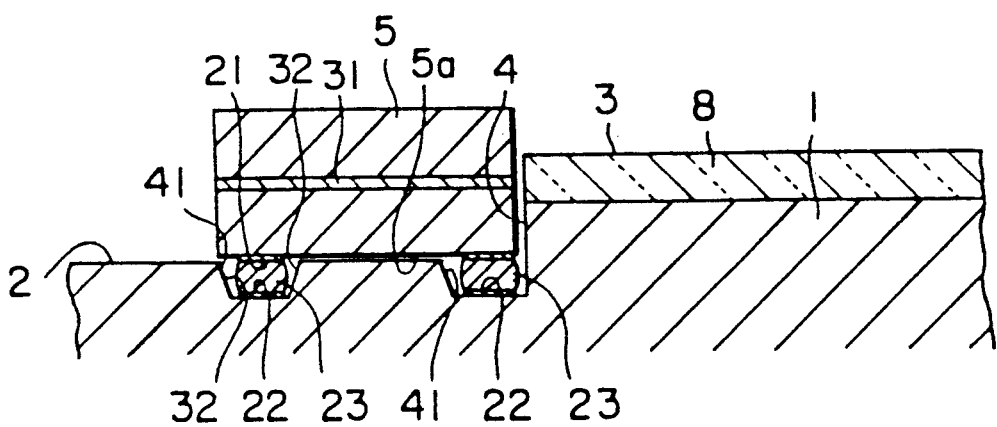
FIG. 6 is a sectional view of an optical semiconductor module according to a second embodiment of this invention.

Referring to FIG. 6, an optical semiconductor module according to a second embodiment of this invention comprises the substrate 1 which has the principal surface 2, the secondary surface 3 and the side surface 4, like in FIG. 4. The illustrated substrate 1 has a plurality of recesses 41 each of which is recessed from the principal surface 2. Each of the recesses 41 has a recess depth of approximately 5 μm which is shallower than the height of each solder bump 23 of approximately 20 μm. Each of the recesses 41 is recessed by etching the principal surface 2 prior to deposition of the second electrodes 22.

As to a method of mounting the optical semiconductor chip 5 on the principal surface 2 through solder bumps 23 to manufacture the optical semiconductor module illustrated in FIG. 6, each first electrode 21 is at first deposited on the chip surface 5a of the optical semiconductor chip 5. Thereafter, the principal surface 2 is selectively etched to define the preselected portions of the substrate 1. Thus, internal side walls 32 are formed by side surfaces of the recesses 41. Accordingly, the side walls 32 in FIG. 6 are made of semiconductor materials, although those in FIGS. 4 and 5 are made of insulating (or non-conductive) materials. Then, each second electrode 22 which has a thickness of approximately 3,000 Å is formed on the preselected portion so that each second electrode 22 is surrounded by the side walls 32 formed by the recesses 41.

Since each second electrode 22 is surrounded by the side walls 32 defined by the recesses 41 each of which has a recess depth of approximately 5 μm, the optical semiconductor chip 5 is kept in a height or vertical direction at a position where the chip surface 5a of the optical semiconductor chip 5 comes into contact with the principal surface 2. At the position, the optical semiconductor chip 5 is supported on the principal surface 2 so that the optical element 31 is precisely flush with the optical waveguide 8. Accordingly, precise chip positioning in both horizontal and vertical directions is accomplished also in the optical semiconductor module illustrated in FIG. 6.

While this invention has thus far been described in conjunction with only two embodiments thereof, it will readily be possible for those skilled in the art to put this invention into practice in various other manners. For example, the optical waveguide 8 is not always coupled to the optical semiconductor chip 5. In other words, the optical semiconductor chip 5 alone may be mounted on the substrate 1. On the other hand, the optical waveguide 8 may be replaced by an optical fiber. Besides, the optical element 31 may not be restricted to the LD array. Moreover, the optical semiconductor chip 5 may include any elements other than the optical element 31.

What is claimed is:

1. An optical semiconductor module, comprising:
   a substrate;
   an optical semiconductor chip which has a chip surface and which is mounted on said substrate;

a plurality of first electrodes deposited on said chip surface;

a plurality of second electrodes deposited on said substrate and electrically connected to said first electrodes;

a plurality of shrunk bumps each of which has a first height, said shrunk bumps being electrically connected between said first and said second electrodes; and a side wall having a second height and substantially surrounding said shrunk bumps, said second height being substantially equal to said first height.

2. An optical semiconductor module as claimed in claim 1, wherein said substrate has a principal surface on which said plurality of second electrodes are deposited, a secondary surface elevated from said principal surface, a side surface contiguous to said principal and said secondary surfaces, and an optical waveguide laid on said secondary surface with a prescribed height kept relative to said principal surface, said optical semiconductor chip having an optical element which is supported on said principal surface so that said optical element becomes substantially flush with said optical waveguide.

3. An optical semiconductor device as recited in claim 1, wherein said side wall is defined by an insulating layer formed on top of said substrate.

4. An optical semiconductor module as claimed in claim 3, wherein said second electrodes are formed by a Cr-Pt-Au composition and said insulating layer is made of $SiO_2$.

5. An optical semiconductor module as claimed in claim 3, wherein said second electrodes have a thickness of approximately 3,000 Å and said insulating layer has a thickness of approximately 5 $\mu$m.

6. An optical semiconductor device as recited in claim 3, wherein said first height is approximately 5 $\mu$m and said second height is approximately 5 $\mu$m.

7. An optical semiconductor device as recited in claim 1, wherein said optical semiconductor chip rests substantially in contact with a surface contiguous with said side wall and substantially parallel with a bottom surface of said optical semiconductor chip.

8. An optical semiconductor module as claimed in claim 1, said substrate having a principal surface, wherein said substrate has a plurality of recesses each of which is recessed from said principal surface, said recesses defining said side wall and having a recess depth not deeper than said first height.

9. An optical semiconductor module as claimed in claim 8, wherein each of said recesses is recessed by etching prior to deposition of said second electrodes.

10. An optical semiconductor device as recited in claim 8, wherein said recess depth is substantially equal to said first height.

11. An optical semiconductor module comprising:

an optical semiconductor chip mounted on a substrate, said optical semiconductor chip having a chip surface on which a plurality of first electrodes are deposited, said substrate having a plurality of second electrodes which are electrically connected to said first electrodes through a plurality of shrunk bumps each of which has a first height, each of said shrunk bumps being surrounded by a side wall which has a wall height substantially equal to said first height and which is offset relative to said substrate.

* * * * *